United States Patent
Yeh

[11] Patent Number: 6,162,717
[45] Date of Patent: Dec. 19, 2000

[54] METHOD OF MANUFACTURING MOS GATE UTILIZING A NITRIDATION REACTION

[75] Inventor: Ta-Hsun Yeh, Hsinchu, Taiwan

[73] Assignees: ProMOS Technologies, Inc; Mosel Vitelic, Inc., both of Hsinchu, Taiwan; Siemens AG, Munich, Germany

[21] Appl. No.: 09/128,187

[22] Filed: Aug. 3, 1998

[30] Foreign Application Priority Data

Jun. 19, 1998 [TW] Taiwan ................................ 87109851

[51] Int. Cl.$^7$ .................. H01L 21/3205; H01L 21/4763
[52] U.S. Cl. .................... 438/595; 438/265; 438/485; 438/762; 438/775
[58] Field of Search ................... 438/265, 485, 438/513, 582, 583, 591, 595, 762, 763, 775

[56] References Cited

U.S. PATENT DOCUMENTS

| | | | |
|---|---|---|---|
| 4,660,276 | 4/1987 | Hsu | 438/303 |
| 5,221,632 | 6/1993 | Kurimoto et al. | 438/305 |
| 5,573,965 | 11/1996 | Chen et al. | 438/297 |
| 5,827,769 | 10/1998 | Aminzadeh et al. | 438/305 |
| 5,861,329 | 1/1999 | Yeh et al. | 438/232 |
| 5,866,460 | 2/1999 | Akram et al. | 438/306 |

FOREIGN PATENT DOCUMENTS 401173635A  7/1989  Japan.

*Primary Examiner*—Carl Whitehead, Jr.
*Assistant Examiner*—Jamie L. Davis
*Attorney, Agent, or Firm*—Thomas, Kayden, Horstemeyer & Risley

[57] ABSTRACT

A method of forming the gate structure of a MOS device forms a gate structure over a semiconductor substrate and then treats the sidewalls of the gate structure with nitrous oxide plasma so that the silicon and tungsten atoms within the gate structure can react with activated nitrogen in the plasma to form chemical bonds. Hence, a protective layer is formed on the gate sidewalls, thereby increasing thermal stability of the tungsten suicide layer and the polysilicon layer within the gate structure. Thereafter, an oxide material is formed over the protective layer using a rapid thermal oxidation. Next, spacers are formed over the sidewall oxide layer. Finally, subsequent operations necessary for forming a complete MOS device are performed.

12 Claims, 4 Drawing Sheets

METHOD OF MANUFACTURING MOS GATE UTILIZING A NITRIDATION REACTION

CROSS-REFERENCE TO RELATED APPLICATION

This application claims the priority benefit of Taiwan application serial no. 87109851, filed Jun. 19, 1998, the full disclosure of which is incorporated herein by reference.

BACKGROUND OF THE INVENTION

1. Field of Invention

The present invention relates to a method of manufacturing integrated circuit. More particularly, the present invention relates to a method of manufacturing the gate of a metal-oxide-semiconductor (MOS) device.

2. Description of Related Art

Because refractory metal silicide has the special properties of a high melting point, thermal stability and low resistivity, it is now extensively used in the fabrication of VLSI devices in semiconductor industry. Refractory metal silicide is usually formed between a silicon layer and an aluminum layer for improving their ohmic contact. The refractory metal silicide is also formed as part of the metallic layer in a MOS gate. The most commonly used refractory metal silicide comprises tungsten silicide ($WSi_x$).

Polycide layers are now routinely used in commercial VLSI production processes that involve the formation of gate conductive layers. Tungsten silicide is normally deposited over other material using a low-pressure chemical vapor deposition (LPCVD) or a sputtering method. After the polysilicon layer and the tungsten silicide layer are properly deposited, photolithographic and etching operations are used to pattern the polycide layer to form the gate structure of a MOS. Since the line width of a conductive layer must be controlled precisely, the polycide layer must also be etched using an anisotropic dry etching operation.

FIGS. 1A through 1D are cross-sectional views showing the progression of manufacturing steps in forming the gate structure of a MOS device according to a conventional method.

First, as shown in FIG. 1A, a semiconductor substrate 100 is provided. Then, a polysilicon layer 102, a tungsten silicide layer 104 and a silicon nitride layer 106 are sequentially formed over the substrate 100. For example, the polysilicon layer 102 can be formed using a low-pressure chemical vapor deposition (LPCVD) method, the tungsten silicide layer 104 can be formed using a physical vapor deposition (PVD) or LPCVD method, and the silicon nitride layer 106 can be formed by again using a LPCVD method. Since a high temperature is required when silicon nitride is deposited over the tungsten silicide layer 104, re-crystallization of the tungsten silicide layer 104 occurs. Consequently, crystal grains are formed in the tungsten silicide layer 104, resulting in the formation of a great many grain boundaries.

Next, photolithographic and etching operations are carried out to remove a portion of the polysilicon layer 102, the tungsten silicide layer 104 and the silicon nitride layer 106 as shown in FIG. 1B. The remaining polysilicon layer 102a, tungsten silicide layer 104a and silicon nitride layer 106a form a composite gate structure 107.

Next, a rapid thermal oxidation (RTO) at 1050° C. of the sidewalls of the gate structure 107 is carried out as shown in FIG. 1C. The reason for performing the RTO operation is to form an oxide layer 108 over the sidewall of the gate structure 107 so that the gate structure 107 is protected. In addition, plasma induced damage during gate etching stage also can be annealed out by RTO. However, since the tungsten silicide layer 104a has great many grain boundaries, the rapid temperature rise and rapid oxidation in a RTO operation leads to the irregular growth of grains inside the tungsten silicide layer 104a. Ultimately, a tungsten silicide layer 104b as shown in FIG. 1C is formed. Irregular grain growth inside the tungsten silicide layer 104a is due to high reactivity at the grain boundaries. Therefore, reactive gases for carrying out the oxidation can easily penetrate into the interior of the tungsten silicide layer. Consequently, tungsten silicide material in the interior is also oxidized, thereby forcing its way out through the sidewalls of the gate structure. Hence, originally flat sidewalls of the gate structure now have protrusions in places where the tungsten silicide layer 104b is located.

Next, as shown in FIG. 1D, silicon nitride spacers 110 are formed covering the oxide layer 108 on the sidewalls of the gate structure 107. Since the tungsten silicide layer 104b has created some protrusions along the sidewalls of the gate structure 107, spacers 110 are unable to fully cover the tungsten silicide layer 104b. This may lead to a short-circuiting of the ultimately formed integrated circuit device. Consequently, product yield is be low.

In light of the foregoing, there is a need to improve the method of forming the gate structure of a MOS device.

SUMMARY OF THE INVENTION

Accordingly, the present invention provides a method of forming the gate structure of a MOS device. Through the formation of an additional protective layer over the sidewalls of a gate structure, protrusions of the tungsten silicide layer out from the gate sidewalls due to oxidation can be avoided. Consequently, spacers can completely cover the sidewalls of the gate structure, thereby maintaining device integrity and high product yield.

To achieve these and other advantages and in accordance with the purpose of the invention, as embodied and broadly described herein, the invention provides a method of forming the gate structure of a MOS device. The method comprises the steps of sequentially forming a polysilicon layer, a tungsten silicide layer and a silicon nitride layer over a semiconductor substrate. Then, photolithographic and etching operations are used to form a gate structure over the substrate. Next, nitrous oxide plasma is used to treat the sidewalls of the gate structure so that chemical bonds are formed between silicon and tungsten within the gate as well as the activated nitrogen provided by the plasma. Hence, a protective layer is formed over the sidewalls, and thermal stability of the tungsten silicide layer and the polysilicon layer within the gate structure is improved. Thereafter, rapid thermal oxidation is carried out to form oxide layers over the protective layer of the gate sidewalls. Finally, spacers are formed over the sidewall oxide layer followed by subsequent operations necessary for forming the MOS device.

It is to be understood that both the foregoing general description and the following detailed description are exemplary, and are intended to provide further explanation of the invention as claimed.

BRIEF DESCRIPTION OF THE DRAWINGS

The accompanying drawings are comprised to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
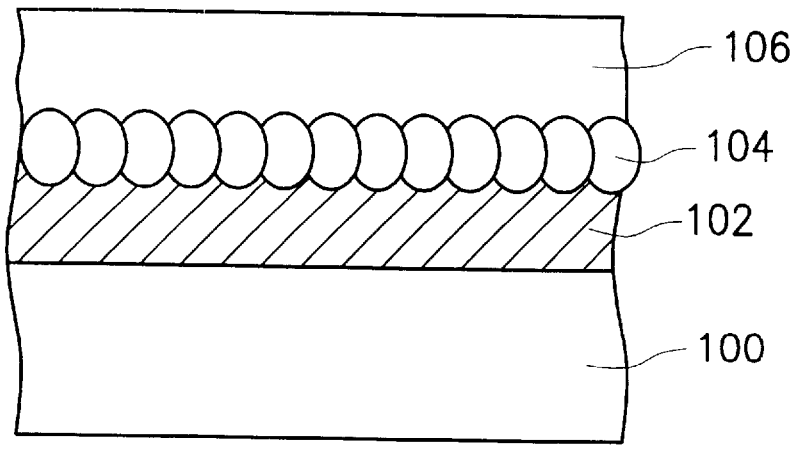
FIGS. 1A through 1D are cross-sectional views showing the progression of manufacturing steps in forming the gate structure of a MOS device according to a conventional method.
Figure 1B:
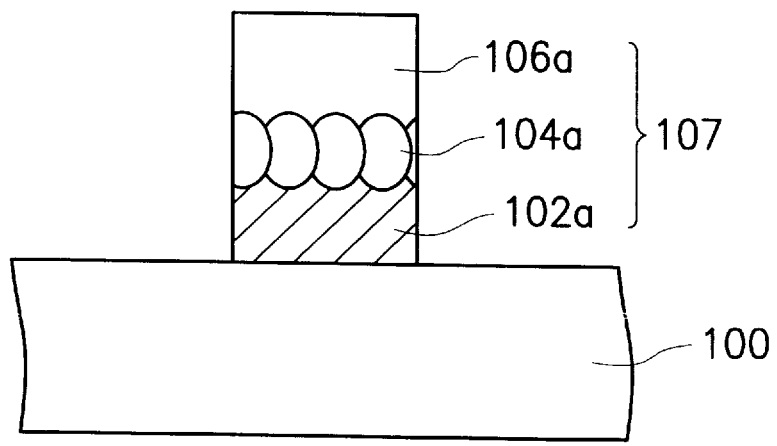
Figure 1C:
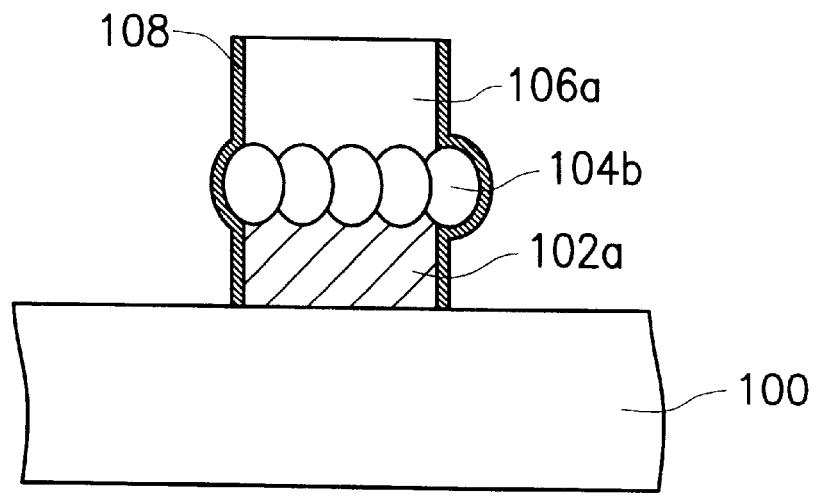
Figure 1D:
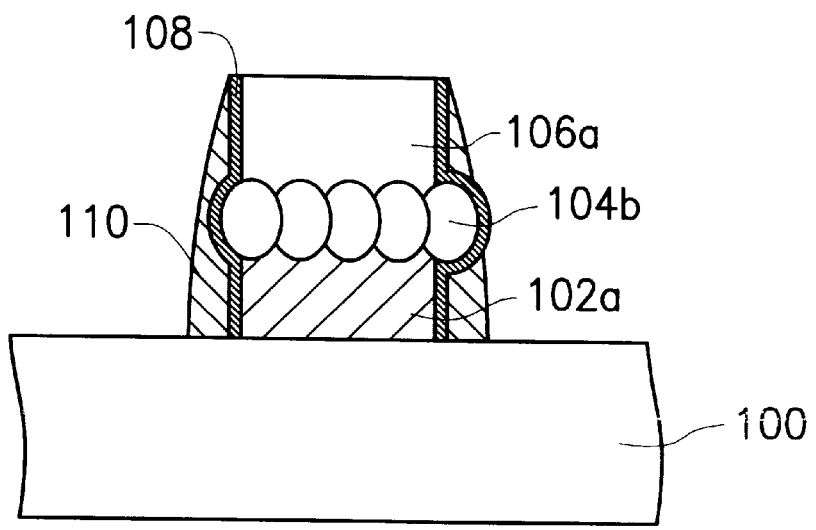

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2E are cross-sectional views showing the progression of manufacturing steps in forming the gate structure of a MOS device according to one preferred embodiment of this invention.

Figure 2A:
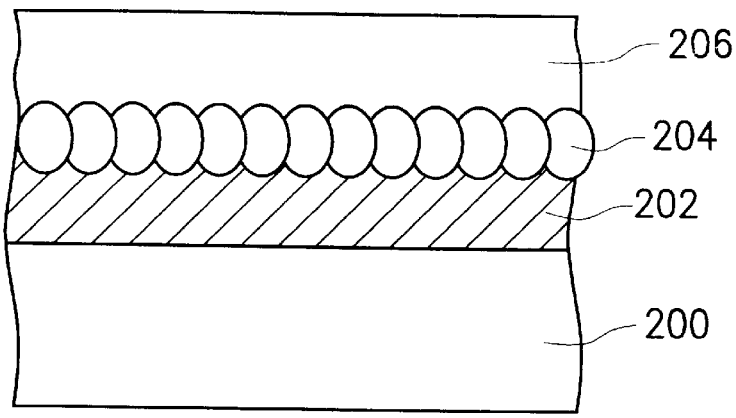
FIGS. 2A through 2E are cross-sectional views showing the progression of manufacturing steps in forming the gate structure of a MOS device according to one preferred embodiment of this invention.

First, as shown in FIG. 2A, a semiconductor substrate 200 is provided. Then, a polysilicon layer 202, a tungsten silicide layer 204 and a silicon nitride layer 206 are sequentially formed over the substrate 200. For example, the polysilicon layer 202 can be formed using a low-pressure chemical vapor deposition (LPCVD) method, the tungsten silicide layer 204 can be formed using a physical vapor deposition (PVD) or LPCVD method, and the silicon nitride layer 206 can be formed by again using a LPCVD method.

Figure 2B:
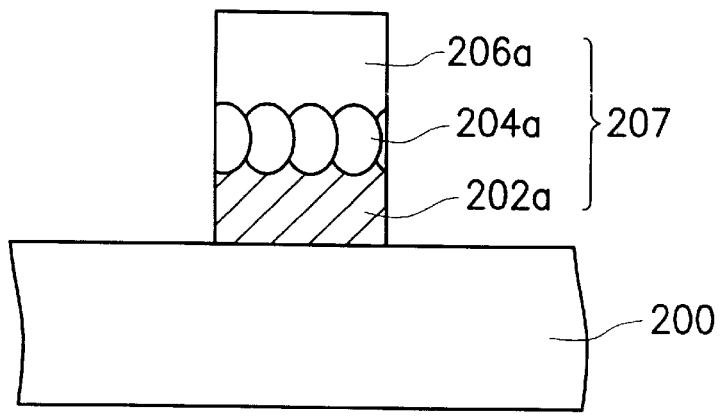

Next, photolithographic and etching operations are carried out to remove a portion of the polysilicon layer 202, the tungsten suicide layer 204 and the silicon nitride layer 206 as shown in FIG. 2B. The remaining polysilicon layer 202a, tungsten silicide layer 204a and silicon nitride layer 206a form a composite gate structure 207.

Figure 2C:
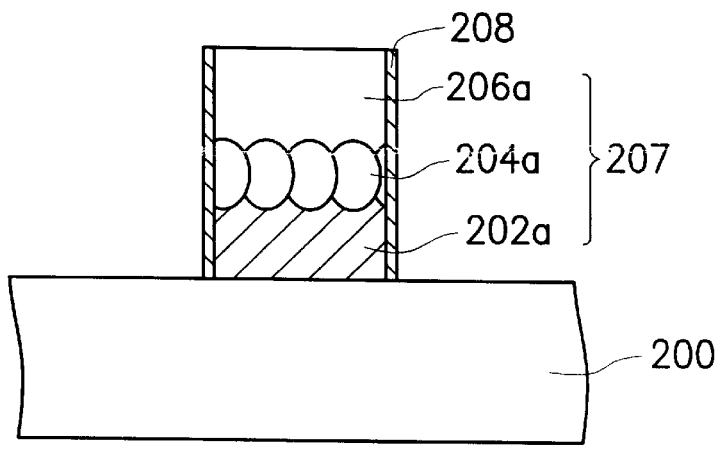

Next, as shown in FIG. 2C, a nitridation reaction is carried out to form a protective layer 208 over the sidewalls of the gate structure 207. The nitridation operation can be conducted at room temperature using nitrous oxide ($N_2O$) plasma and permitted to react for about 180 seconds, for example. The protective layer 208 having a thickness of about 6 nm can be a tungsten-nitrogen-oxygen (W—N—O) layer.

Since the activated nitrogen in the plasma can react with the elements on the sidewall of the gate structure to form tungsten-nitrogen and silicon-nitrogen bonds, thermal stability of tungsten silicide and polysilicon is improved. In the meantime, the unreacted atomic nitrogen migrates into the crevices between grain boundaries, completely sealing the sidewall surface. Hence, further re-crystallization of the tungsten silicide during subsequent RTO process is limited, and abnormal growth of the tungsten silicide layer is prevented.

In addition, the activated oxygen within the plasma also undergoes reaction to form tungsten-oxygen and silicon-oxygen bonds. Because oxygen in the plasma has high reactivity, the oxygen has already reacted with the tungsten silicide layer 204a on the surface before the oxygen atoms have the chance to diffuse into the interior of the tungsten silicide layer 204a. Moreover, once a protective layer 208 is formed over the surface of the tungsten silicide layer 204a, entrance of any oxygen atoms into the tungsten silicide interior is prevented.

Figure 2D:
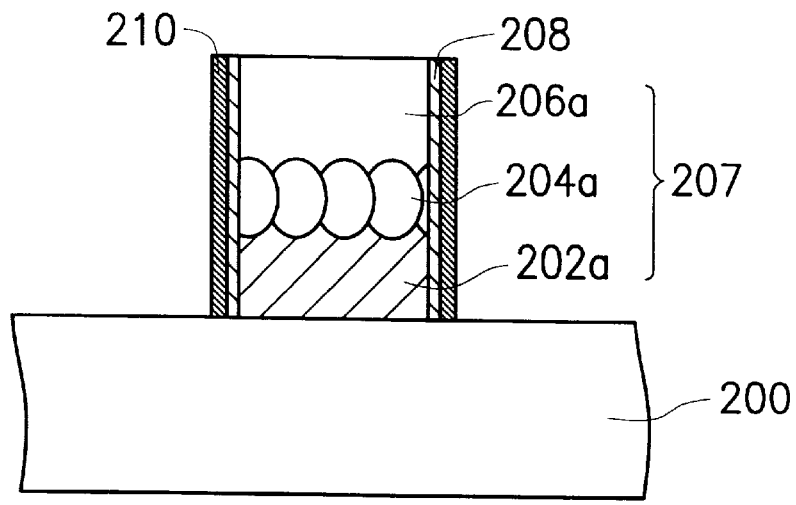

Next, as shown in FIG. 2D, an oxidation reaction is carried out to form an oxide layer 210 over the protective layer 208. The oxidation reaction is conducted using, for example, a rapid thermal oxidation at a temperature of about 1050° C. After oxygen atoms in the plasma have reacted with elements on the sidewalls of the gate structure, tungsten-oxygen and silicon-oxygen bonds are formed, further strengthening the connectivity between the tungsten, silicon and oxygen atoms.

Hence, oxygen used in the oxidation reaction is difficult to pass into the tungsten silicide layer 204a. Moreover, the tungsten-nitrogen bond is very strong and so the protection is superior. Because grain boundaries of tungsten silicide layer are sealed by nitrogen atoms formed earlier on, oxygen atoms in the oxidation reaction are unable to penetrate through the barrier into the grain boundaries of the tungsten silicide layer.

Figure 2E:
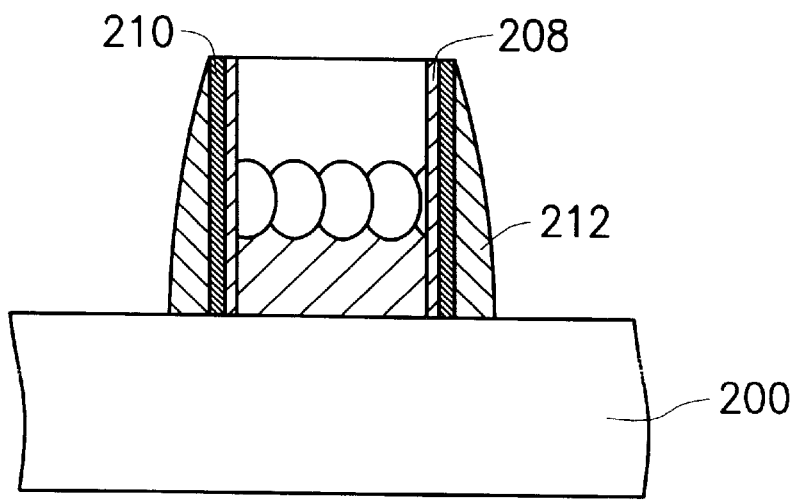

Thereafter, as shown in FIG. 2E, spacers 212 are formed over the oxide layers 210 of the gate structure 207. The spacers 212 can be made from a material that comprises silicon nitride. The spacers can be formed, for example, by first depositing silicon nitride (not shown) over the substrate structure, and then etching back to remove a portion of the silicon nitride layer. Finally, subsequent operations for forming the MOS device are carried out. Since these operations are not directly related to this invention and should be familiar to anyone familiar with semiconductor manufacturing, detailed description is omitted here.

In summary, one major aspect of this invention is the utilization of plasma to treat the sidewalls of the gate structure so that a protective layer is formed over the gate sidewalls. Hence, oxygen atoms are unable to enter the gate structure and react inside the tungsten silicide layer when an oxidation reaction is subsequently carried out. Without the entrance of oxygen atoms, abnormal growth of the tungsten silicide layer is prevented and so no protrusions are formed on the gate sidewalls.

Another aspect of this invention is the use of nitrous oxide plasma to carry out the plasma treatment. The activated nitrogen atoms in the plasma forms strong bonds with the tungsten atoms, and any unreacted nitrogen atoms fill the grain boundaries of the tungsten silicide. Hence, oxygen atoms are unable to penetrate into the grain boundaries when a subsequent oxidation reaction is carried out.

One further aspect of this invention is that the plasma nitridation reaction can be carried out at a low temperature. Consequently, the reaction does not add to the total thermal budget. Furthermore, the protective layer formed by the plasma treatment operation can enhance the thermal stability of tungsten silicide layer and polysilicon layer, and hence is capable of restraining the abnormal growth of the tungsten silicide layer.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing the gate of a MOS device, the method comprising the steps of:

providing a semiconductor substrate having a gate structure formed thereon, wherein the gate structure comprises at least a tungsten silicide layer;

forming a tungsten-nitrogen-oxygen protective layer over sidewalls of the gate structure by nitridation reaction using plasma; and forming an oxide layer directly on the protective layer.

2. The method of claim 1, wherein the plasma comprises nitrous oxide plasma.

3. The method of claim 1, wherein the step of forming the protective layer comprises reacting with the plasma for about 180 seconds.

4. The method of claim 1, wherein the protective layer has a thickness of about 6 nm.

5. The method of claim 1, wherein the step of forming the oxide layer comprises a rapid thermal oxidation.

6. A method of manufacturing the gate of a MOS device, the method comprising the steps of:

provi ding a semiconductor substrate having a gate structure formed thereon wherein the gate structure comprises at least a tungsten silicide layer;

performing a plasma reaction with nitrous oxide plasma to form a tungsten-nitrogen-oxygen protective layer over sidewalls of the gate structure;

forming an oxide layer over the protective layer; and forming spacers over the oxide layer.

7. The method of claim 6, wherein the step of forming the protective layer comprises reacting with the nitrous oxide plasma for about 180 seconds.

8. The method of claim 6, wherein the protective layer has a thickness of about 6 nm.

9. The method of claim 6, wherein the step of forming the oxide layer comprises a rapid thermal oxidation.

10. The method of claim 6, wherein the step of forming the spacers comprises depositing silicon nitride.

11. The method of claim 6, wherein the step of forming the spacers comprises the steps of:

depositing a silicon nitride layer over the gate structure and the oxide layer; and removing a portion of the silicon nitride layer to form spacers over the oxide layer on the sidewalls of the gate structure.

12. The method of claim 11, wherein the step of removing a portion of the silicon nitride layer comprises an etching back method.

* * * * *